(12) United States Patent
Fujima (10) Patent No.: US 6,809,982 B2
(45) Date of Patent: Oct. 26, 2004

(54) DEFECTIVE CELL REMEDY METHOD CAPABLE OF AUTOMATICALLY CUTTING CAPACITOR FUSES WITHIN THE FABRICATION PROCESS

(75) Inventor: Shiro Fujima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/437,699

(22) Filed: May 14, 2003

(65) Prior Publication Data

US 2003/0213954 A1 Nov. 20, 2003

(30) Foreign Application Priority Data

May 20, 2002 (JP) ........................................ 2002-144827

(51) Int. Cl.[7] .............................................. G11C 17/16
(52) U.S. Cl. ............... 365/225.7; 365/201; 365/189.07; 365/200; 365/230.08; 365/96; 365/94
(58) Field of Search ........................... 365/201, 189.07, 365/189.04, 200, 230.08, 225.7, 148, 96, 94, 100, 102

(56) References Cited

U.S. PATENT DOCUMENTS

| 6,163,488 | A | * | 12/2000 | Tanizaki et al. | ............. 365/200 |
| 6,642,602 | B2 | * | 11/2003 | Lehmann et al. | ............. 257/530 |
| 6,728,126 | B1 | * | 4/2004 | Issaq et al. | ..................... 365/96 |
| 6,751,149 | B2 | * | 6/2004 | Seyyedy et al. | ......... 365/225.7 |

FOREIGN PATENT DOCUMENTS

| JP | 2000-82296 | 3/2000 | ........... G11C/29/00 |
| JP | 2000-90689 | 3/2000 | ........... G11C/29/00 |
| JP | 2000-207896 | 7/2000 | ........... G11C/29/00 |
| JP | 2000-208637 | 7/2000 | ........... H01L/21/82 |
| JP | 2001-210094 | 8/2001 | ........... G11C/29/00 |
| JP | 2001-283597 | 10/2001 | ........... G11C/29/00 |

* cited by examiner

Primary Examiner—Andrew Q. Tran
(74) Attorney, Agent, or Firm—Choate, Hall & Stewart (57) ABSTRACT

A method is disclosed for remedying defective cells that enables automatic cutting of capacitor fuses as part of the fabrication process. A comparison circuit determines whether defective cells are present in a memory cell array by comparing data that have been read from an I/O bus with data that have been determined in advance to determine whether the data are identical and supplies the determination result as a determination signal. An address buffer circuit, upon receiving a determination signal from the comparison circuit, latches the row address signal and column address signal that are being supplied as output at that time and supplies these latched signals as a capacitor fuse row address signal and a capacitor fuse column address signal for cutting capacitor fuses. Capacitor fuses in a capacitor fuse block are then each cut based on the capacitor fuse row/column address signals that have been latched by the address buffer circuit.

4 Claims, 9 Drawing Sheets

DEFECTIVE CELL REMEDY METHOD CAPABLE OF AUTOMATICALLY CUTTING CAPACITOR FUSES WITHIN THE FABRICATION PROCESS

BACKGROUND OF THE INVENTION

1. Field of the Invention

The present invention relates to a semiconductor memory device such as SDRAM (Synchronous Dynamic Random Access Memory), and more particularly to a semiconductor memory device that uses capacitor fuses to effect a one-bit remedy, and to a method of remedying a defective cell.

2. Description of the Related Art

Semiconductor memory devices such as DRAM are provided with a large number of memory cells, and it is therefore inevitable that some memory cells will be defective memory cells, i.e., cells that do not function properly. Discarding the entire semiconductor memory device as a defective product when such a defective memory cell occurs increases the cost of fabricating the semiconductor memory device, and various methods have therefore been proposed as methods of remedying defective cells that occur.

When a defective cell is discovered in an investigation of a semiconductor memory device in the wafer state, the defective cell is replaced by a redundant cell that has been prepared in advance to maintain the overall integrity of the semiconductor memory device. To effect this replacement, it is necessary to store the address of the defective cell, and fuse elements are used to store the address of this defective cell. Fuse elements include elements that normally function as resistor elements but that blow out upon the flow of an overcurrent and thus enter an insulating state, and elements that are cut by the irradiation of a laser beam.

However, because the formation of a resistor element requires a certain amount of surface area, the use of these resistor elements as fuse elements raises the problem of increase in the layout area with increase in the number of fuse elements that are used. On the other hand, once a semiconductor memory device has been packaged, a laser beam cannot be irradiated to cut the fuse elements.

Capacitor fuses are therefore used for remedying defective cells that are discovered after packaging. A capacitor fuse is an element in which the application of a high voltage across two electrodes that are normally in an insulating state can bring about a dielectric breakdown that destroys a dielectric film and thus place the two electrodes in a connected state. By using such a capacitor fuse, one fuse element can be realized in the same layout area that is required for one memory cell. In addition, cutting of a capacitor fuse requires only the application of a high voltage to the capacitor fuse, and it is therefore possible to cut a capacitor fuse after a semiconductor memory device has been packaged.

In contrast to a normal fuse element, which functions as a resistor element before cutting and then enters an open state after cutting, a capacitor fuse functions as a capacitor with an open state established between two terminals before cutting and then functions as a resistor element after cutting.

As a method of remedying defective cells after a semiconductor memory device has been packaged, a method has been proposed in recent years that uses a one-bit remedy employing the above-described capacitor fuse. When a defective cell is discovered after a semiconductor memory device has been packaged, this one-bit remedy method stores the data that was to be stored in the defective cell in a storage circuit such as a latch circuit.

In this one-bit remedy, the discovery of a defective cell does not result in the separate storage of only the data that are stored in the defective cell. Instead, a unit of cells that are activated by a column selection circuit (Y-switch circuit) are taken as the unit of simultaneous remedy, and all of the data that are stored in all memory cells that are included in this simultaneous remedy unit are separately stored.

Figure 1:
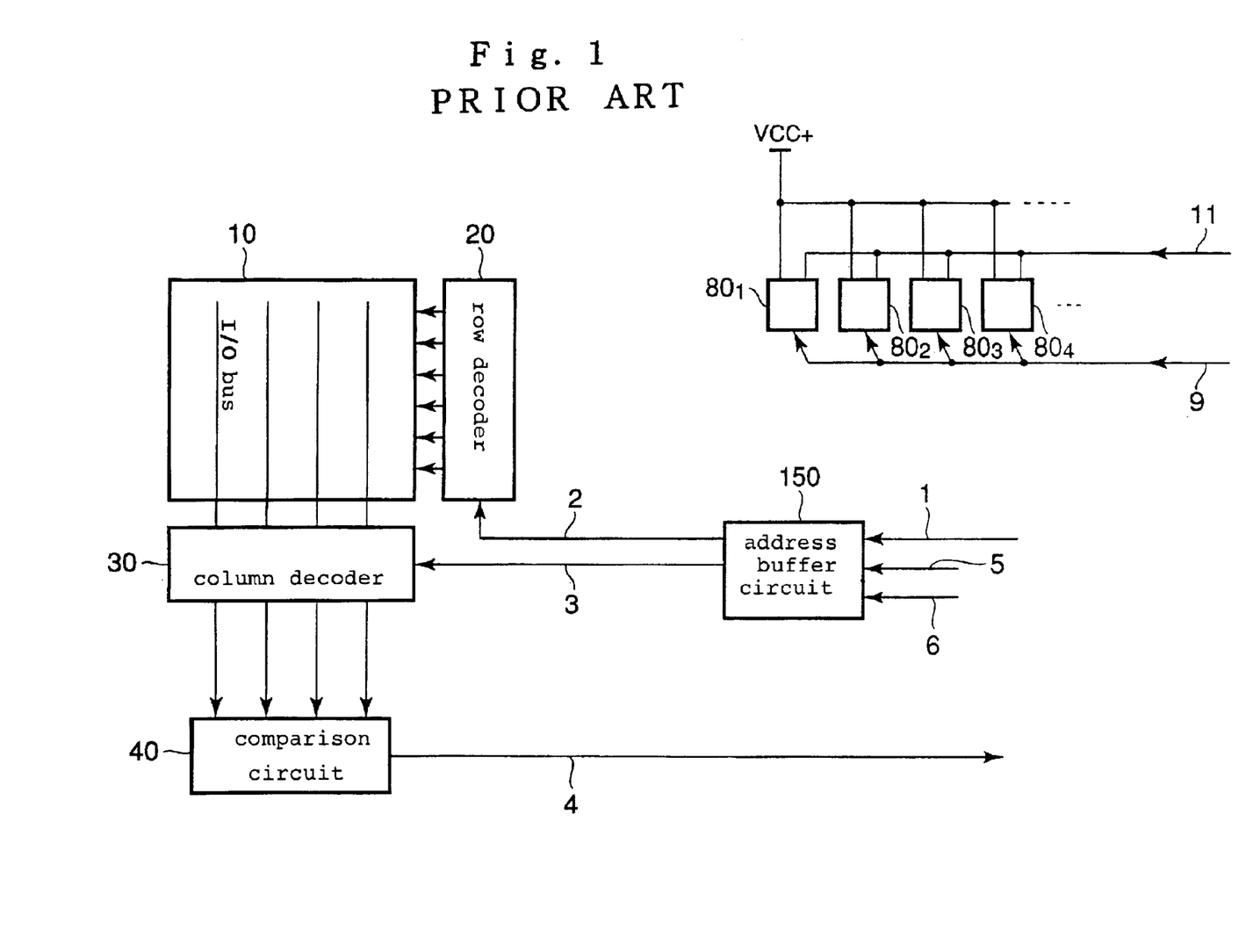
FIG. 1 is a block diagram showing the construction of a semiconductor memory device of the prior art.

FIG. 1 shows the construction of a semiconductor memory device of the prior art that effects this type of one-bit remedy. As shown in FIG. 1, this semiconductor memory device of the prior art is provided with memory cell array 10 that is composed of a plurality of memory cells, row decoder 20, column decoder 30, comparison circuit 40, address buffer circuit 150, and capacitor fuse blocks $80_1$–$80_n$.

An external address signal that is used in, for example DRAM, is composed of alternately arranged row addresses and column addresses. As a result, address buffer circuit 150 not only divides external address signal 1 that is applied from outside the semiconductor memory device into row address signal 2 and column address signal 3, but also holds row address signal 2 and column address signal 3 until external address signal 1 designates the next address.

Figure 2:
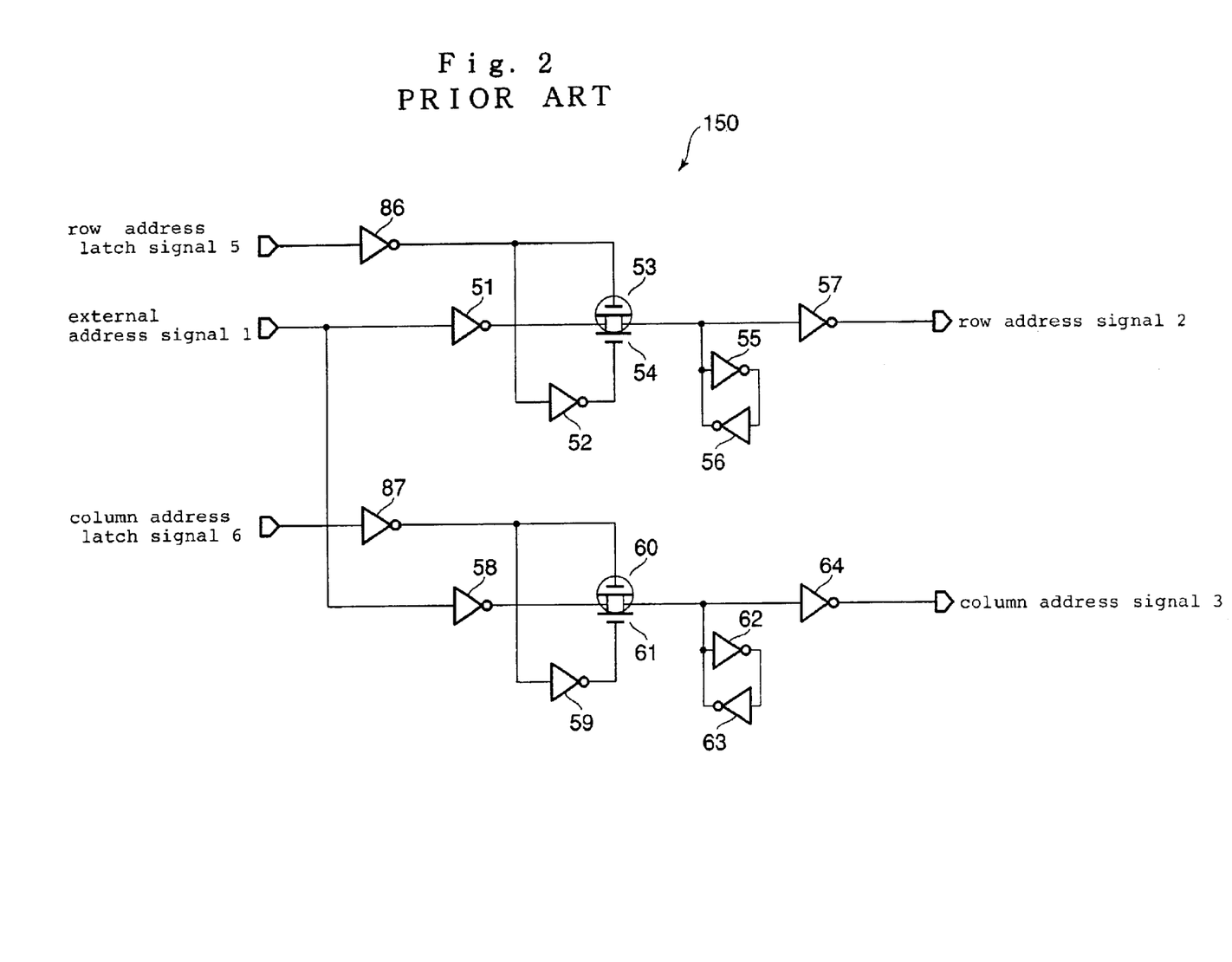
FIG. 2 is a circuit diagram showing the configuration of address buffer circuit 150 in FIG. 1.

FIG. 2 shows a specific composition of this address buffer circuit 150. As shown in FIG. 2, address buffer circuit 150 is provided with inverter circuits 51, 52, 55–57, 58, 59, 62–64, 86, and 87; p-channel MOS transistors 53 and 60; and n-channel MOS transistors 54 and 61. This composition that is shown in FIG. 2 is for a one-bit portion of the address signal, and in an actual address buffer circuit, the circuit structure that is shown in FIG. 2 is provided in a number equal to the number of bits of the address signal.

In addition, row address latch signal 5 and column address latch signal 6 are applied as input to this address buffer circuit 150 as shown in FIG. 1, and when external address signal 1 indicates a row address, row address latch signal 5 becomes high level for a fixed interval; and when external address signal 1 indicates a column address, column address latch signal 6 becomes high level for a fixed interval.

Inverter circuits 86 and 87 invert row address latch signal 5 and column address latch signal 6, respectively, and supply the result as output. Inverter circuits 51 and 58 invert external address signal 1 and supply the result as output. Inverter circuit 52 inverts the output of inverter circuit 86 and supplies the result to the gate of n-channel MOS transistor 54. Inverter circuit 59 inverts the output of inverter circuit 87 and supplies the result to the gate of n-channel MOS transistor 61.

P-channel MOS transistor 53 receives the output of inverter circuit 86 at its gate, turns on when row address latch signal 5 becomes high level and the output of inverter circuit 86 becomes low level, and supplies the output of inverter circuit 51 to data holding unit that is composed of inverter circuits 55 and 56. N-channel MOS transistor 54 receives the output of inverter circuit 52 at its gate, and, as with p-channel MOS transistor 53, turns on when row address latch signal 5 becomes high level and supplies the output of inverter circuit 51 to a data holding unit that is composed of inverter circuits 55 and 56.

Inverter circuits 55 and 56 each invert the output of the other and thus hold signals that are transmitted by way of p-channel MOS transistor 53 and n-channel MOS transistor 54. Inverter circuit 57 inverts the value that is held by inverter circuits 55 and 56 and supplies the result as row address signal 2.

P-channel MOS transistor 60 receives the output of inverter circuit 87 at its gate, turns on when column address latch signal 6 becomes high level and the output of inverter circuit 87 becomes low level, and supplies the output of inverter circuit 58 to the data holding unit that is composed of inverter circuits 62 and 63. N-channel MOS transistor 61 receives the output of inverter circuit 59 at its gate, and, similar to p-channel MOS transistor 60, turns on when column address latch signal 6 becomes high level and supplies the output of inverter circuit 58 to the data holding unit that is composed of inverter circuits 62 and 63.

Inverter circuits 62 and 63 each invert the output of the other and thereby hold the signal that is transmitted by way of p-channel MOS transistor 60 and n-channel MOS transistor 61. Inverter circuit 64 inverts the value that is held by inverter circuits 62 and 63 and supplies the result as column address signal 3.

According to the above-described construction of address buffer circuit 150, the change of row address latch signal 5 to high level causes the row address that is contained in external address signal 1 to be latched and supplied as row address signal 2; and the change of column address latch signal 6 to high level causes the column address that is contained in external address signal 1 to be latched and supplied as column address signal 3.

Row decoder 20 that is shown in FIG. 1 activates the word line that is designated by row address signal 2 from address buffer circuit 150. Column decoder 30 activates the column selection signal that is designated by column address signal 3 from address buffer circuit 150 and connects the bit line with the I/O bus.

Comparison circuit 40 that is shown in FIG. 1 is a circuit that operates when the semiconductor memory device is to be checked. This comparison circuit 40 reads, to outside the memory cell array by way of the I/O bus, the data of bit lines that are selected by the plurality of column selection signals that have been selected simultaneously by column decoder 30, compares this data to determine whether defective cells are present in memory cell array 10, and supplies the determination results as determination signal 4.

Figure 3A:
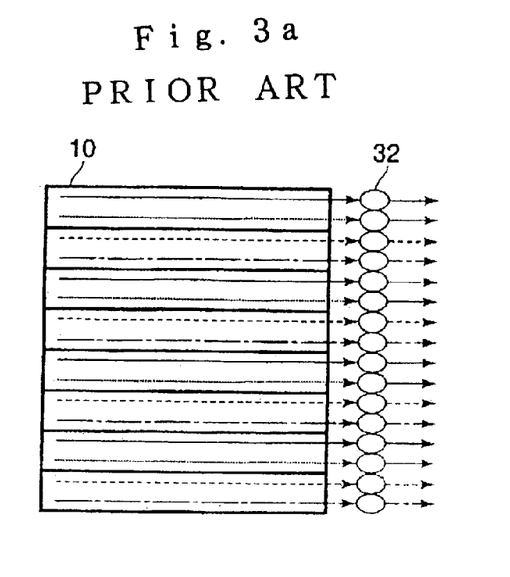
FIG. 3a is provided for explaining an I/O compression test.

For example, when memory cell array 10 that is shown in FIG. 1 is provided with 16 I/O buses, an I/O compression test is carried out by a method such as shown in FIG. 3a.

In FIG. 3a, the data that are represented by the solid lines, dotted lines, broken lines, and dot-and-dash lines are each different, but data that are represented by the same type of line are identical. The data from this memory cell array 10 are applied to comparison circuit 40 by way of data amplifiers 32 and subjected to an I/O compression test.

Figure 3B:
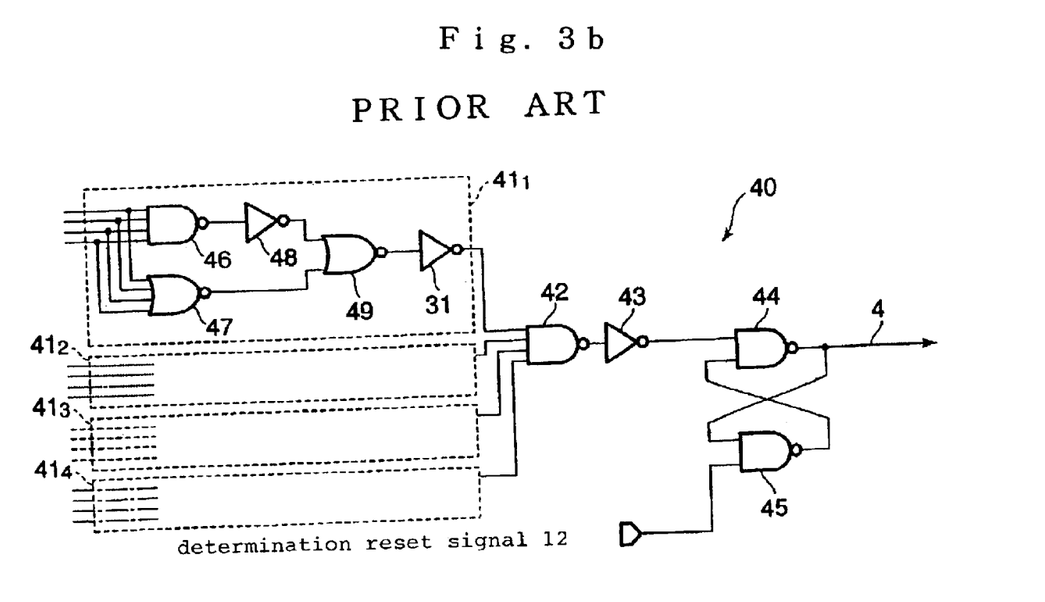
FIG. 3b is a circuit diagram showing the configuration of comparison circuit 40 in FIG. 1.

An actual example of the construction of comparison circuit 40 for carrying out this type of I/O compression test is shown in the circuit diagram of FIG. 3b.

As shown in FIG. 3b, this comparison circuit 40 is composed of four determination blocks $41_1$–$41_4$, NAND circuits 42, 44, and 45, and inverter circuit 43.

The sixteen items of data that are applied as input to comparison circuit 40 are each arranged in groups of data that should be the same and then applied as input to a respective block of four determination blocks $41_1$–$41_4$.

Determination block $41_1$ is composed of NAND circuit 46, NOR circuits 47 and 49, and inverter circuits 48 and 31. NAND circuit 46 inverts the calculated logical product of the four items of data that are applied as input to determination block $41_1$, and supplies the result as output. Inverter circuit 48 inverts the output of NAND circuit 46 and supplies the result as output. NOR circuit 47 inverts the calculated logical sum of the four items of data that are applied as input to determination block $41_1$ and supplies the result as output. NOR circuit 49 then inverts the result of calculating the logical sum of the output from inverter circuit 48 and the output of NOR circuit 47 and supplies the result as output. Inverter circuit 31 then inverts the output of NOR circuit 49 and supplies the result as output to NAND circuit 42.

According to the above-described construction, determination block $41_1$ supplies a high-level signal when the four signals that have been applied as input are all high level or are all low level, and otherwise supplies a low-level signal. Determination blocks $41_2$–$41_4$ have the same construction and operation as determination block $41_1$, and redundant explanation of these blocks is therefore omitted.

NAND circuit 42 inverts the result of calculating the logical product of the signals from four determination blocks $41_1$–$41_4$ and supplies the result as output. Inverter circuit 43 inverts the output of NAND circuit 42 and supplies the result as output. NAND circuit 44 and 45, which form a latch circuit, latch and invert the output of inverter circuit 43, and supply the result as output.

Determination reset signal 12 is applied as input to NAND circuit 45 that forms a portion of this latch circuit. This determination reset signal 12 is used when the power supply is introduced or when rechecking. This signal is normally low level, and the change of the signal from low level to high level sets determination signal 4 to low level.

As an example, when the four items of data that are supplied to determination block $41_1$ are all high level, the output of NAND circuit 46 becomes low level, and the output of inverter circuit 48 becomes high level. As a result, the output of NOR circuit 49 becomes low level, and the output of inverter circuit 31 becomes high level.

When no defective cells are present within the range of simultaneous remedy that is the object of a check, the output from all four determination blocks $41_1$–$41_4$ are all high level, the output of NAND circuit 42 becomes low level, and the output of inverter circuit 43 becomes high level. In this case, determination reset signal 12 is normally low level, and determination signal 4 becomes low level, indicating that there are no defective cells.

The existence of defective cells within memory cell array 10 is detected by carrying out the above-described check while changing the row addresses and column addresses for every unit of simultaneous remedy. When a defective cell is present within the object of checking, the output of any one of four determination blocks $41_1$–$41_4$ becomes low level, whereby the output of NAND circuit 42 becomes high level and the output of inverter circuit 43 becomes low level. Determination signal 4 thus becomes high level, thereby indicating the existence of a defective cell.

Capacitor fuse blocks $80_1$–$80_n$ are each composed of a plurality of capacitor fuses for storing the row address and column address of a defective cell, and when cut mode signal 11 becomes high level, each capacitor fuse is cut based on the address of the defective cell that is indicated by capacitor fuse address signal 9.

Figure 4:
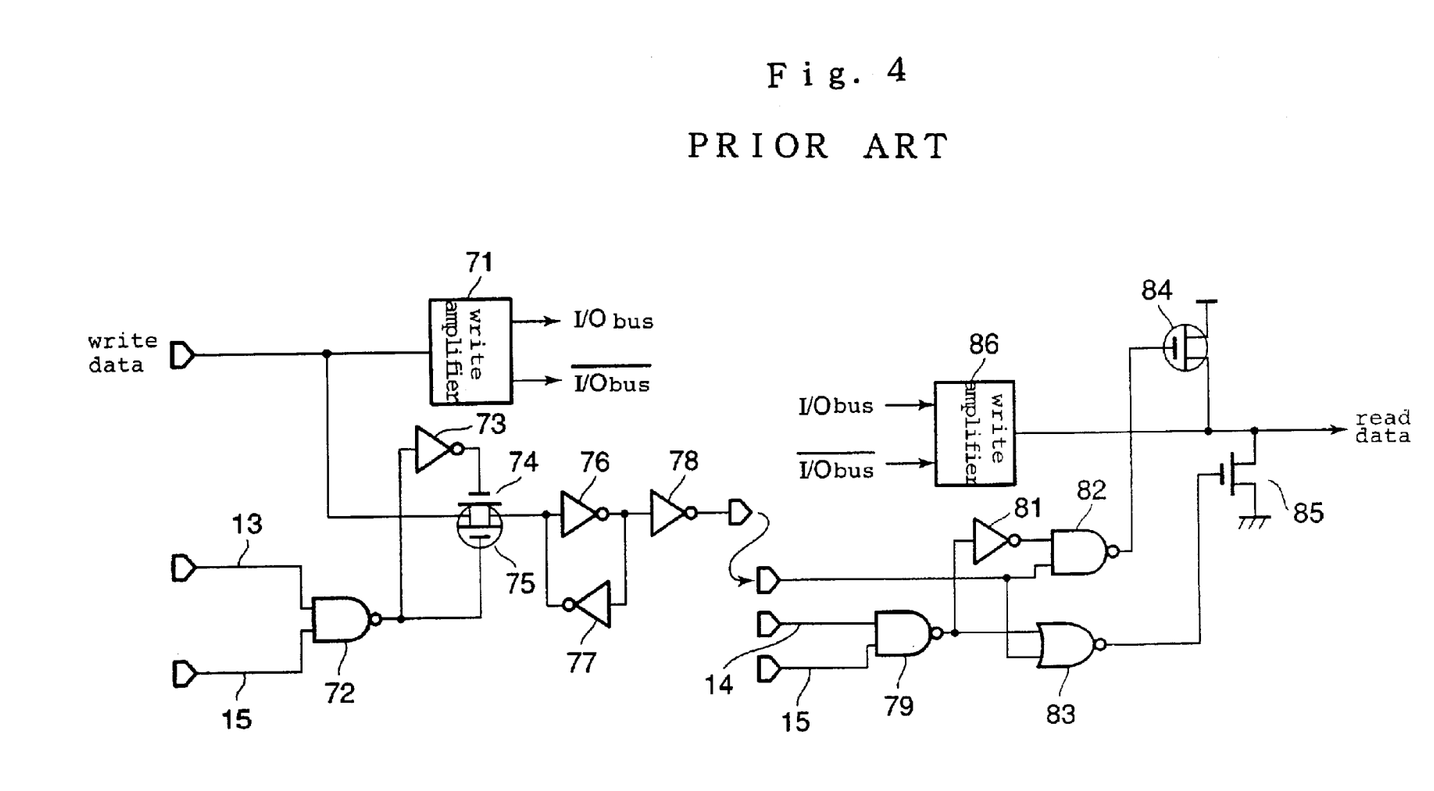
FIG. 4 is a circuit diagram for explaining the operations of a one-bit remedy.

We next refer to FIG. 4 to explain the one-bit remedy operation. The circuit diagram on the left side of FIG. 4 is the circuit diagram for writing data, and the circuit diagram on the right side of FIG. 4 is the circuit diagram for reading data.

In this case, defective cell address detection signal 15 is a signal that becomes high level when the external address signal matches the address of a defective cell that has been programmed into the fuse block in advance. Write amplifier activation signal 13 is a signal that becomes high level when data are to be written, and data amplifier activation signal 14 is a signal that becomes high level when data are to be read.

Explanation first regards the operation for writing data. When external address signal matches with an address that has been programmed into a fuse block and defective cell address detection signal 15 becomes high level, write amplifier activation signal 13 is already high level when data are being written, and the output of NAND circuit 72 therefore becomes low level and p-channel MOS transistor 75 turns on. In addition, the change to low level of the output of NAND circuit 72 causes the output of inverter circuit 73 to become high level and n-channel MOS transistor 74 therefore turns on. As a result, the write data that are received as input at this time are held in inverter circuits 76 and 77.

Explanation next regards the operations for reading data. When defective cell address detection signal 15 is at low level, the output of NAND circuit 79 becomes high level and the output of inverter circuit 81 becomes low level. As a result, the output of NAND circuit 82 becomes high level, the output of NOR circuit 83 becomes high level, and p-channel MOS transistor 84 and n-channel MOS transistor 85 both turn off. In this case, when defective cell address detection signal 15 becomes high level, the output of NAND circuit 79 becomes low level and the output of inverter circuit 81 becomes high level. As a result, the value that is obtained when inverter circuit 78 inverts the value that is held by inverter circuits 76 and 77 is applied as input to NAND circuit 82 and NOR circuit 83. When high-level write data are being held, p-channel MOS transistor 84 turns on and a high-level value is supplied as the read data. Alternatively, when low-level write data are being held, n-channel MOS transistor 85 turns on and a low-level value is supplied as the read data.

Figure 5:
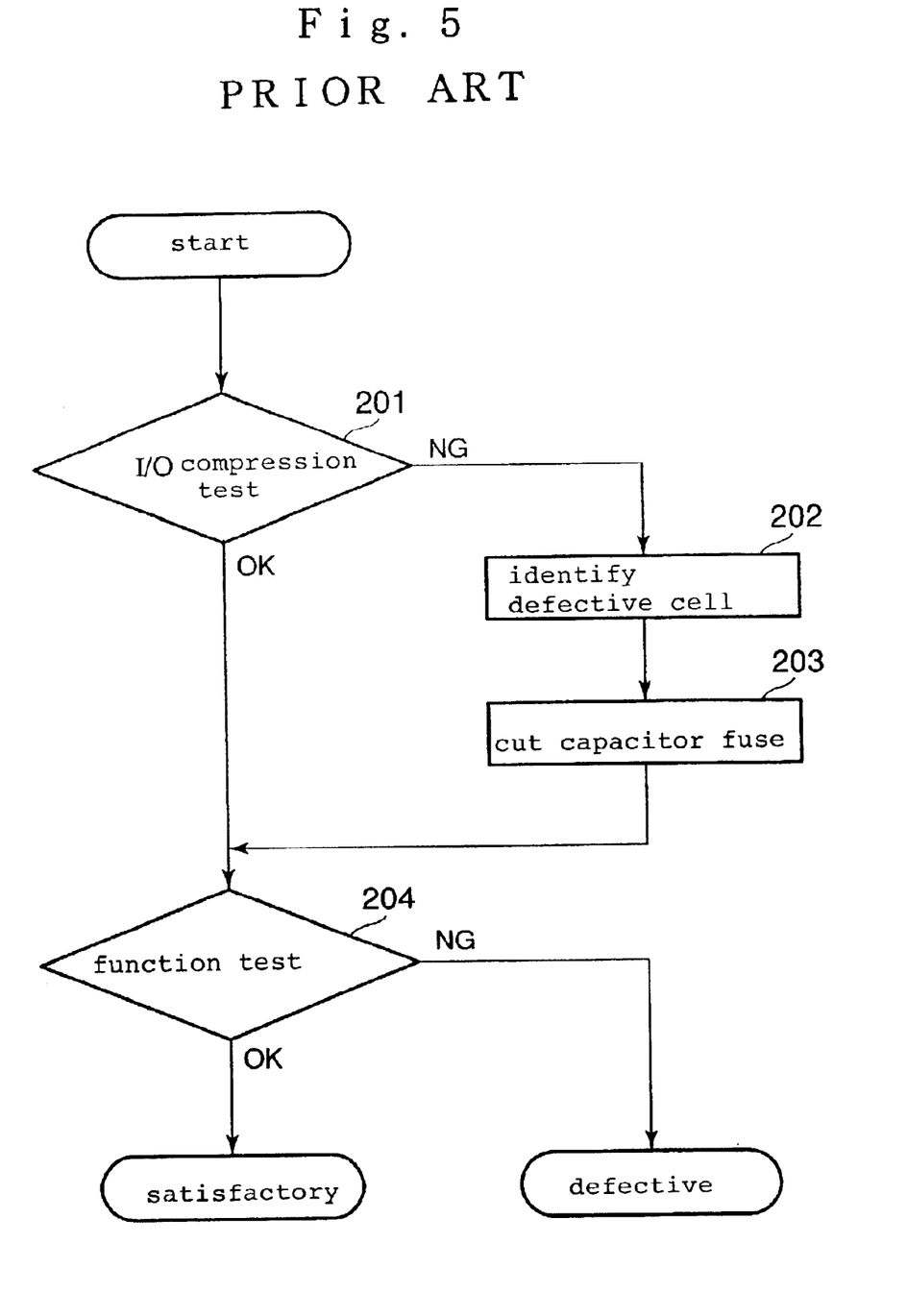
FIG. 5 is a flow chart for explaining the method of remedying a defective cell in a semiconductor memory device of the prior art.

We next refer to the flow chart of FIG. 5 to explain the method of remedying defective cells when in the process of fabricating a prior-art semiconductor memory device of this type. When carrying out packaging in the fabrication process of a semiconductor memory device, an I/O compression test is first carried out in step 201 as previously described to determine whether defective cells are present. If no defective cells are found in the I/O compression test and an "OK" is determined in step 201, tests of the various functions are carried out in step 204 and, if the product passes all of the tests, the product is determined to be satisfactory. If a problem is discovered in the function tests of step 204, the product is determined to be defective.

If a defective cell is discovered in the I/O compression test in step 201 and "NG" is determined, the identity of the defective cell is next checked in step 202. Then, in step 203, the address of this defective cell is stored by cutting capacitor fuses in order to effect a one-bit remedy. After cutting the capacitor fuses, function tests are carried out in step 204 just as if an "OK" had been determined in the I/O compression test in step 201.

In the method of remedying a defective cell that was described using FIG. 5, two selection steps are provided in the form of an I/O compression test and function tests. Although this I/O compression test is a simple test, the function tests are more detailed tests that include the I/O compression test. Two selection steps are provided in the form of a simple test and a more detailed test because the discovery of a problem after carrying out various tests and the resulting remedy such as a one-bit remedy would necessitate the repeat of all tests from the very start, making all preceding tests pointless. In other words, the ability to detect a problem by means of a simple test can eliminate the time and effort that would be lost in performing other unnecessary tests.

In the remedy method of the prior art that is shown in FIG. 5, a semiconductor memory device that has been determined to be "NG" in the I/O compression test of step 201 is first removed from the fabrication process, following which the defective cell addresses are identified (step 202) and the capacitor fuses cut (step 203) outside the fabrication process. In addition, when identifying the addresses of defective cells, a tester with a fail memory is used that is provided with the capacity for detecting and storing defective cell addresses. However, this tester having a fail memory is more expensive than a tester that detects only the existence of defective cells, and including a tester having a fail memory in a mass production process would therefore increase the costs of fabricating the semiconductor memory devices. In addition, the determination of "NG" in the I/O compression test necessitates further checking of all of the memory cells, the determination of the addresses of defective cells, and the cutting of capacitor fuses, all these steps being above and beyond the normal fabrication process, and thus raises the problems of not only increasing the time and effort expended in the test process but greatly complicating the test process. Finally, the need to provide an expensive tester having a fail memory in a mass production process entails the further problem of increasing costs of plant and equipment investment.

SUMMARY OF THE INVENTION

It is an object of the present invention to provide a semiconductor memory device and a method for remedying defective cells that can not only simplify the test process by eliminating the time and effort that is above and beyond the fabrication process, but also limit investment in equipment by eliminating the need for a tester having a fail memory.

To achieve the above-described object, the semiconductor memory device of the present invention is provided with a comparison circuit, an address buffer circuit, and a capacitor fuse block.

The comparison circuit compares a plurality of data that have been simultaneously read from a memory cell array in a test process for checking for the presence of defective cells to determine whether a defective cell exists in the memory cell array and supplies the determination result as a determination signal.

The address buffer circuit splits an external address signal into row addresses and column addresses and supplies the result as output, and further, upon input of a determination signal from the comparison circuit, latches the row address and column address that are being supplied at that time and supplies the latched row address and column address as the capacitor fuse address for cutting capacitor fuses.

The capacitor fuse block is composed of a plurality of capacitor fuses and effects the cutting of each of the capacitor fuse elements based on capacitor fuse addresses that have been latched by the address buffer circuit.

In addition, as a test for checking for the existence of defective cells in a semiconductor memory device of the present invention, the comparison circuit may perform an I/O compression test for detecting the existence of defective cells by comparing data that have been read from memory cells within a simultaneous remedy range in which a one-bit remedy is effected.

According to the present invention, when a defective cell has been detected in a test process for checking for the existence of defective cells, the address buffer circuit latches the row address and column address at the time the defective cell was detected and supplies the row address and column address as a capacitor fuse address; and the capacitor fuse block then cuts each capacitor fuse based on this capacitor fuse address. Accordingly, cutting of capacitor fuses can be carried out automatically as a part of the fabrication process and the need for detecting the address of a defective cell outside the fabrication process can be eliminated. The present invention can also eliminate the expense of time and effort outside the fabrication process, can simplify the test process, and finally, by eliminating the need for a tester having a fail memory, can limit investment in equipment.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 6:
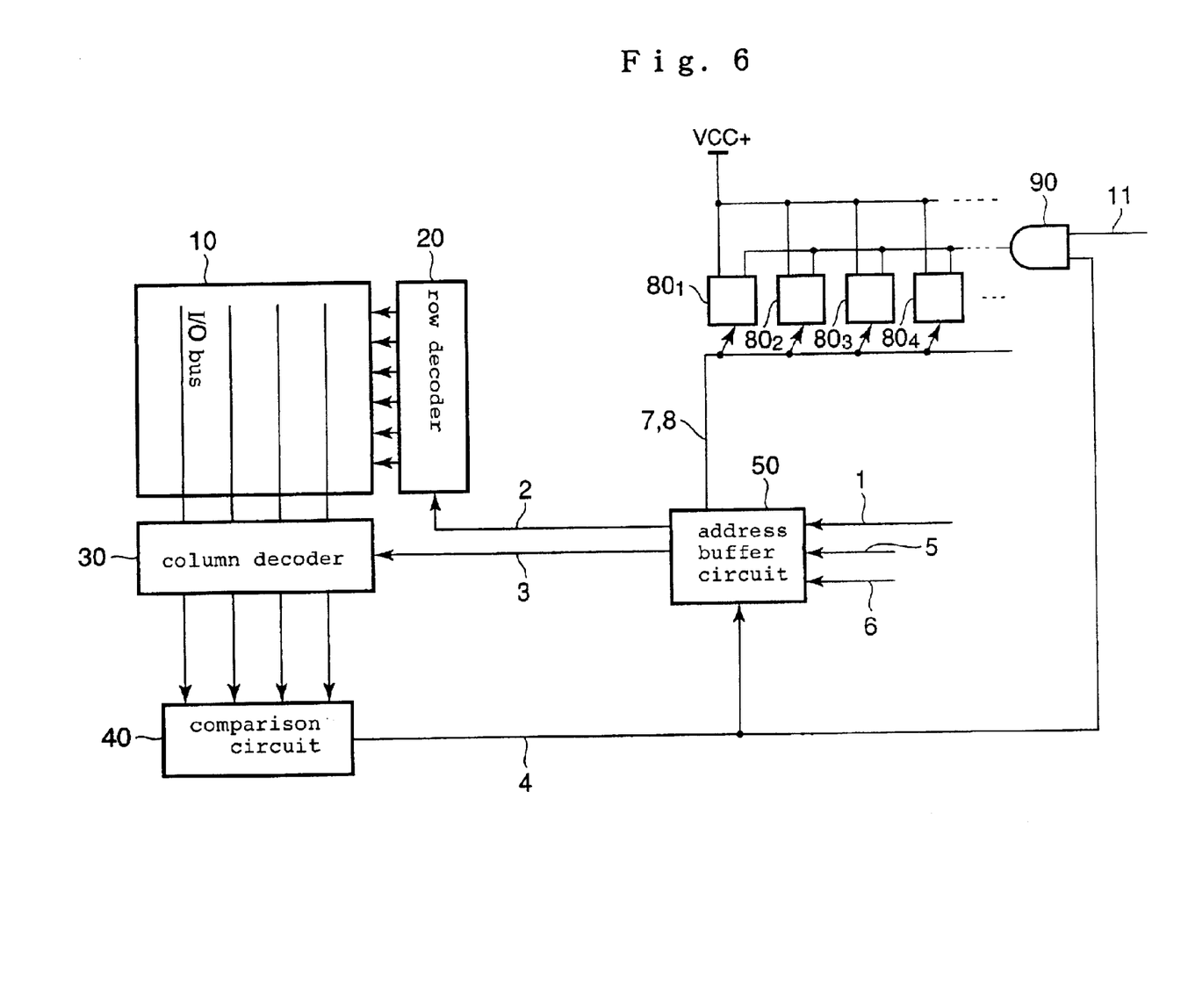
FIG. 6 is a block diagram showing the construction of a semiconductor memory device of an embodiment of the present invention.

We now refer to FIG. 6, in which is shown a block diagram of the construction of a semiconductor memory device of an embodiment of the present invention. In FIG. 6, constituent elements that are the same as constituent elements in FIG. 1 are identified by the same reference numerals, and redundant explanation regarding these constituent elements is here omitted.

The points of difference between the semiconductor memory device of the present invention and the semiconductor memory device of the prior art that is shown in FIG. 1 include the replacement of address buffer circuit 150 by address buffer circuit 50 and the additional provision of AND circuit 90. In addition, the semiconductor memory device of the present embodiment that is shown in FIG. 6 is constructed such that determination signal 4 that is supplied as output from comparison circuit 40 is applied as input to address buffer circuit 50; and capacitor fuse blocks $80_1$–$80_n$ are programmed by capacitor fuse row address signal 7 and capacitor fuse column address signal 8 that are the output of address buffer circuit 50. In other words, each of the capacitor fuses of capacitor fuse blocks $80_1$–$80_n$ in the semiconductor memory device of the present embodiment are cut based on capacitor fuse row/column address signals 7 and 8 that are latched by address buffer circuit 50.

AND circuit 90 calculates the logical product of cut mode signal 11 and determination signal 4 and supplies this calculation result as output to each of capacitor fuse blocks $80_1$–$80_n$.

Figure 7:
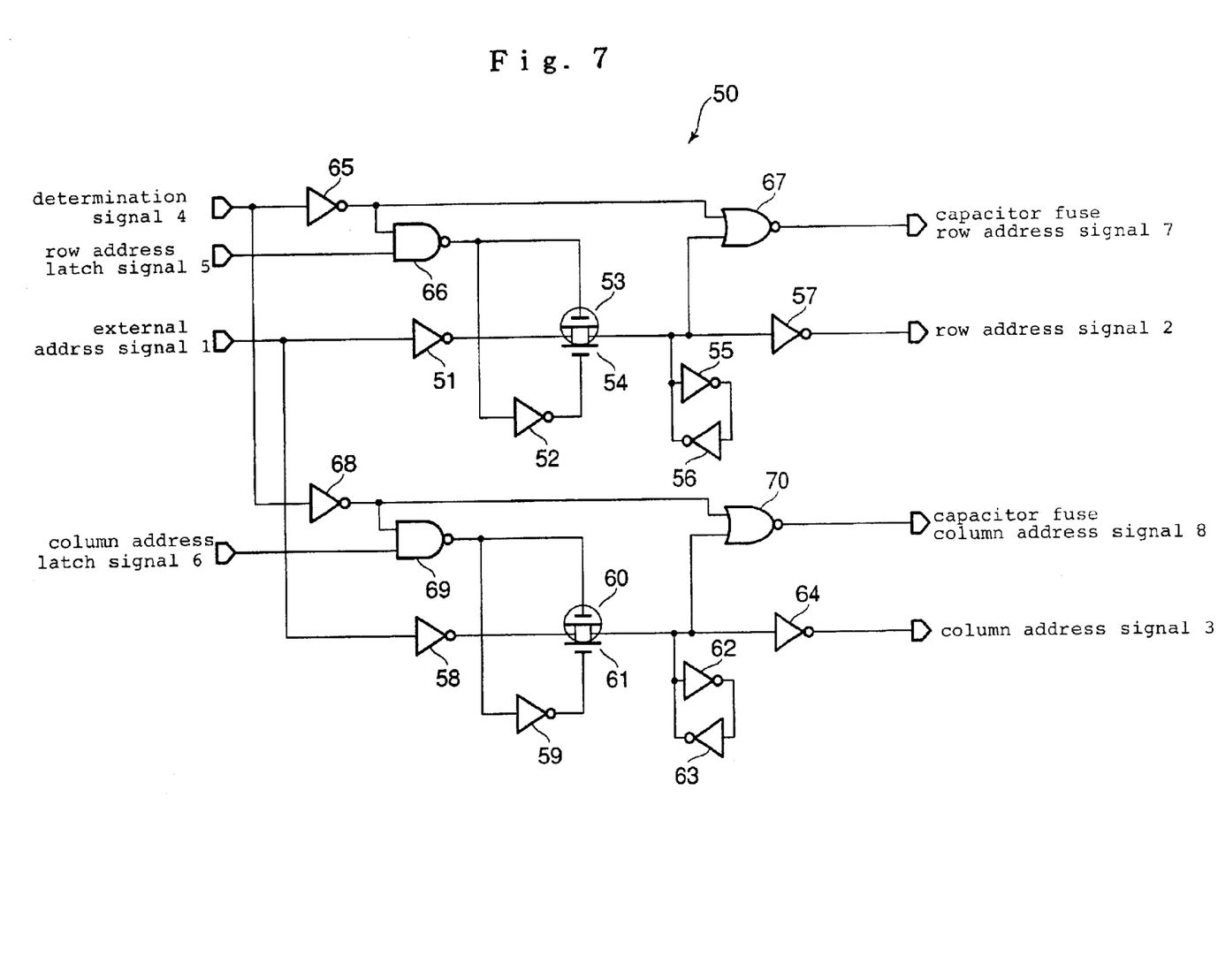
FIG. 7 is a circuit diagram showing the construction of address buffer circuit 50 in FIG. 6.

The construction of address buffer circuit 50 in the semiconductor memory device of the present embodiment is shown in FIG. 7. In FIG. 7, constituent elements that are identical to constituent elements in FIG. 2 are identified by the same reference numerals, and redundant explanation of these constituent elements are here omitted.

As shown in FIG. 7, this address buffer circuit 50 is a construction in which inverter circuits 65 and 68, NAND circuits 66 and 69, and NOR circuits 67 and 70 have been added to address buffer circuit 150 in the semiconductor memory device of the prior art that was shown in FIG. 2.

Inverter circuits 65 and 68 invert determination signal 4 and supply the result as output. NAND circuit 66 inverts the result of calculating the logical product of row address latch signal 5 and the output of inverter circuit 65 and supplies the result as output to the gate of p-channel MOS transistor 53 and inverter circuit 52. NAND circuit 69 inverts the result of calculating the logical product of column address latch signal 6 and the output of inverter circuit 68 and supplies the result as output to the gate of p-channel MOS transistor 60 and inverter circuit 59. NOR circuit 67 inverts the result of calculating the logical sum of the output of inverter circuit 65 and the value that is held by inverter circuits 55 and 56 and supplies the result as capacitor fuse row address signal 7. NOR circuit 70 inverts the result of calculating the logical sum of the output of inverter circuit 68 and the value that is held by inverter circuits 62 and 63 and supplies the result as capacitor fuse column address signal 8.

By means of the above-described circuit structure, address buffer circuit 50 in the semiconductor memory device of the present embodiment, upon receiving determination signal 4 as input from comparison circuit 40, latches row address signal 2 and column address signal 3 that are being supplied at that time and supplies these latched signals 2 and 3 as capacitor fuse row address signal 7 and capacitor fuse column address signal 8 for cutting capacitor fuses.

Figure 8:
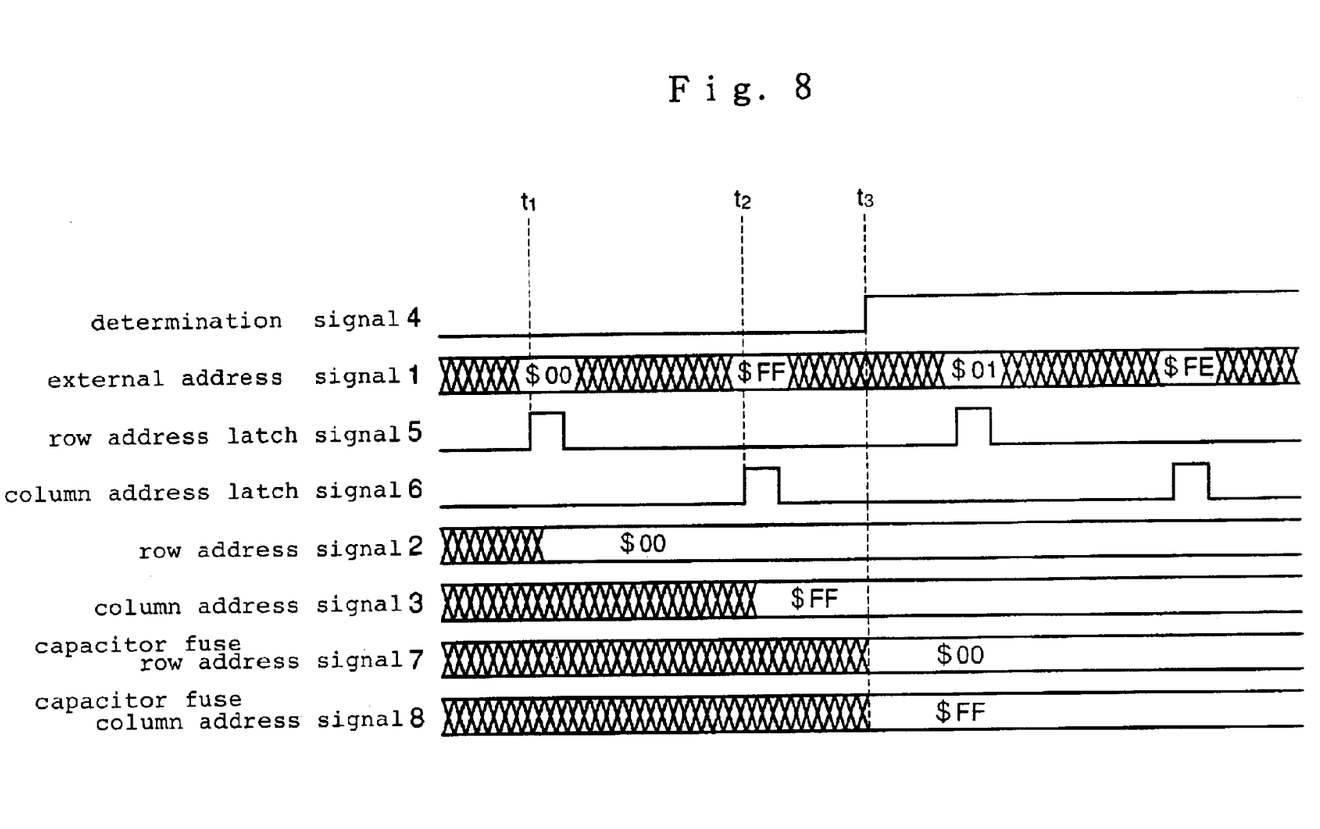
FIG. 8 is a timing chart for explaining the operation of address buffer circuit 50 in FIG. 6.

We next refer to the timing chart of FIG. 8 to describe the operation of this address buffer circuit 50. When no defective cells are discovered and determination signal 4 remains unchanged at low level, the outputs of inverter circuits 65 and 68 are at high level, NAND circuits 66 and 69 supply a high-level output while row address latch signal 5 and column address latch signal 6 are low level, and p-channel MOS transistors 53 and 60 and n-channel MOS transistors 54 and 61 are in the OFF state.

Then, upon the change of row address latch signal 5 or column address latch signal 6 to high level in this state, external address signal 1 at this time is latched and supplied as row address signal 2 or column address signal 3. In the timing chart of FIG. 8, "$00" in external address signal 1 is latched and supplied as row address signal 2 when row address latch signal 5 becomes high level at time $t_1$; and "$FF" in external address signal 1 is latched and supplied as column address signal 3 when column address latch signal 6 becomes high level at time $t_2$.

On the other hand, when a defective cell is discovered in this state and determination signal 4 becomes high level as shown at time $t_3$ in FIG. 8, the outputs of inverter circuits 65 and 68 become low level, and the outputs of NAND circuits 66 and 69 become high level regardless of the logic of row address latch signal 5 and column address latch signal 6. As a result, p-channel MOS transistors 53 and 60 and n-channel MOS transistors 54 and 61 turn off and do not accept address transitions after time $t_3$.

The change of the outputs of inverter circuits 65 and 68 to low level causes NOR circuits 67 and 70 to supply the value that is held in inverter circuits 55 and 56 or the value that is held in inverter circuits 62 and 63 as capacitor fuse row address signal 7 or capacitor fuse column address signal 8, respectively. As a result, "$00" is supplied as capacitor fuse row address signal 7 to the capacitor fuse blocks, and "$FF" is supplied as capacitor fuse column address signal 8 to the capacitor fuse blocks.

Figure 9:
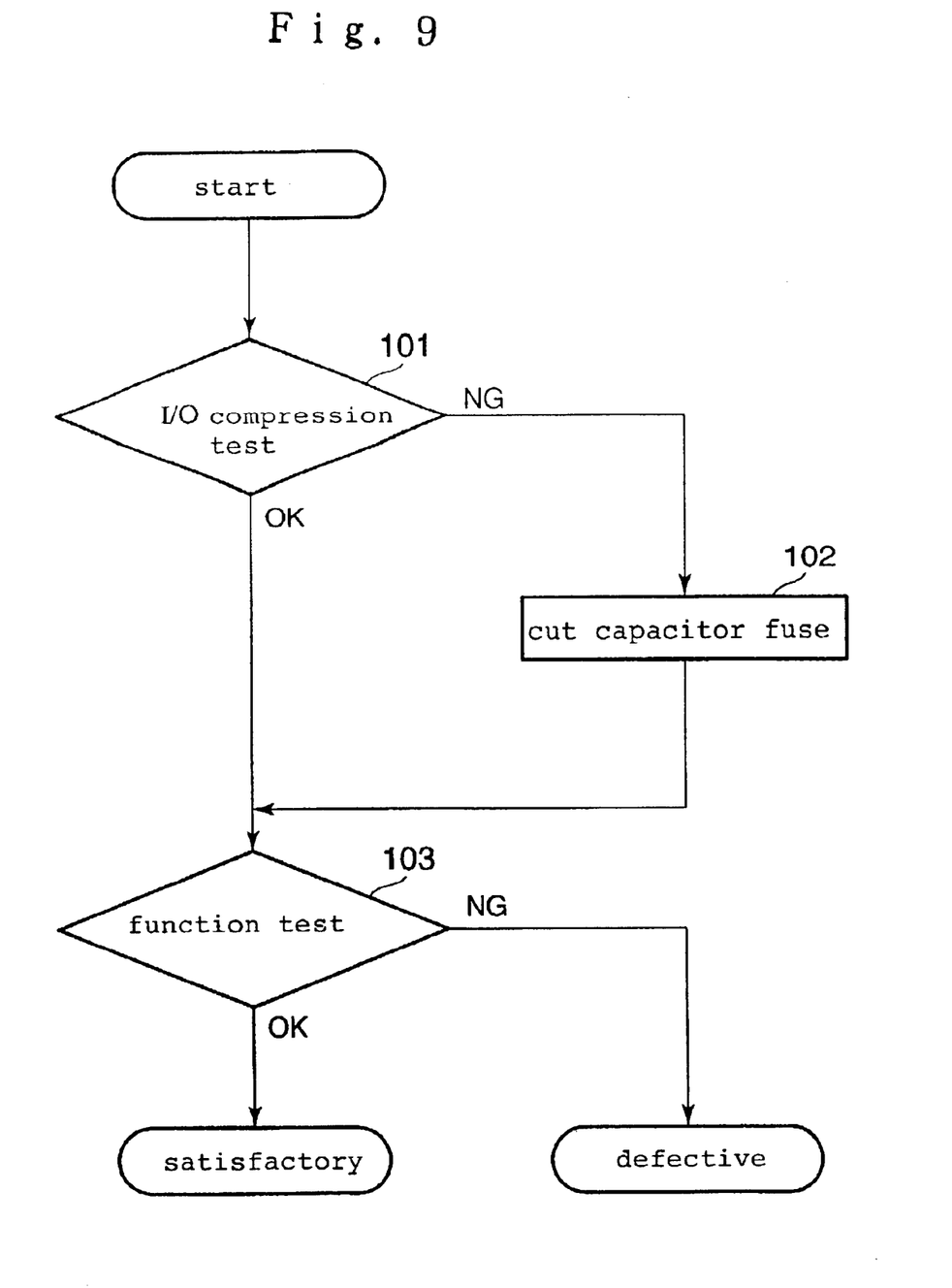
FIG. 9 is a flow chart for explaining the method of remedying a defective cell in the semiconductor memory device of an embodiment of the present invention.

We next refer to the circuit diagrams of FIGS. 6 and 7 and the flow chart of FIG. 9 to describe the remedy method in the process of fabricating a semiconductor memory device of the present embodiment.

When packaging in the fabrication process of the semiconductor memory device, an I/O compression test is carried out to determine the existence of defective cells in step 101, as also described in the prior art. If no defective cells are found in the I/O compression test in step 101 and the device is determined to be "OK," a variety of function tests are further carried out in step 103, and the device is determined to be satisfactory if it passes all of the tests. If a problem is encountered in these function tests of step 103, the device is determined to be defective. The operations to this point are equivalent to the remedy method of the prior art that was described with reference to the flow chart of FIG. 5.

If a defective cell is discovered in the I/O compression test in step 101 and the device is determined to be "NG," comparison circuit 40 sets determination signal 4 to high level. As a result, address buffer circuit 50 latches row address signal 2 and column address signal 3 that are held at that time and supplies these signals as capacitor fuse row address signal 7 and capacitor fuse column address signal 8, respectively, to the corresponding capacitor fuse block among capacitor fuse blocks $80_1$–$80_n$.

The change of determination signal 4 to high level brings about the end of the I/O compression test and causes cut mode signal 11 to become high level, and in step 102, the capacitor fuses are cut in the fabrication process based on capacitor fuse row address signal 7 and capacitor fuse column address signal 8 from address buffer circuit 50. Next, following the cutting of the capacitor fuses, a function test is carried out in step 103 similar to a case in which the device is determined to be "OK" in the I/O compression test in step 101.

In the method of remedying a defective cell of a semiconductor memory device according to the present embodiment as described in the foregoing explanation, when "NG" is determined in the I/O compression test of step 101 and high-level determination signal 4 is supplied from comparison circuit 40, the address of the defective cell is latched as capacitor fuse row address signal 7 and capacitor fuse column address signal 8 by address buffer circuit 50. The cutting of the capacitor fuses is then carried out as a part of the fabrication process based on latched capacitor fuse row address signal 7 and capacitor fuse column address signal 8.

As a result, the method of remedying a defective cell of the present embodiment can eliminate the time and effort involved in once removing a semiconductor memory device that has been determined to be "NG" in the I/O compression test from the fabrication process, detecting the address of the defective cell, and then cutting capacitor fuses, as is required in the prior-art method of remedying a defective cell that was shown in FIG. 5.

In addition, in the method of remedying defective cells of the present embodiment, the latching of the address of the defective cell by address buffer circuit 50 when "NG" is determined in the I/O compression test of step 101 eliminates the need for an expensive tester having a fail memory that is provided with the capability to detect and store a defective cell address.

Although a case was described in which an I/O compression test was used to detect the existence of defective cells in the present embodiment, the present invention is not limited to this form and may be similarly applied in cases in which other testing methods are used to detect the presence of defective cells.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory device comprising:
   a comparison circuit for comparing a plurality of data that have been simultaneously read from a memory cell array in a test process for checking for the existence of defective cells to determine whether a defective cell exists in the memory cell array; and supplying the determination result as a determination signal;
   an address buffer circuit for splitting an external address signal into row addresses and column addresses and supplying the result as output, and further, upon input of the determination signal from said comparison circuit, latching the row address and column address that are being supplied and supplying said latched row address and column address as a capacitor fuse address for cutting capacitor fuses; and
   a capacitor fuse block that is composed of a plurality of capacitor fuses for cutting each of said capacitor fuse elements based on capacitor fuse addresses that have been latched by said address buffer circuit.

2. A semiconductor memory device according to claim 1, wherein said comparison circuit, as a test for checking for the existence of defective cells, performs an I/O compression test for detecting the existence of defective cells by comparing data that have been read from memory cells within a simultaneous remedy range in which a one-bit remedy is performed.

3. A defective cell remedy method for detecting and remedying defective cells in a memory cell array, comprising steps of:
   determining the existence of defective cells in the memory cell array by comparing data, which have been read from the memory cell array in a test process for checking for the existence of defective cells, with predetermined data to determine whether the data are identical;
   when a defective cell has been detected in said test process, latching the row address and column address that are being supplied as output from an address buffer circuit at the time said defective cell was detected and taking said row address and column address as a capacitor fuse address for cutting a capacitor fuse; and
   cutting each of a plurality of capacitor fuses for storing the address of said defective cell based on said capacitor fuse address.

4. A defective cell remedy method according to claim 3, wherein said test for checking for the existence of defective cells is an I/O compression test for detecting the existence of defective cells by comparing data that have been read from memory cells within a simultaneous remedy range for performing a one-bit remedy.

* * * * *